United States Patent
Kim et al.

(10) Patent No.: US 11,625,508 B2
(45) Date of Patent: Apr. 11, 2023

(54) ARTIFICIAL INTELLIGENCE DEVICE FOR GUIDING FURNITURE PLACEMENT AND METHOD OF OPERATING THE SAME

(71) Applicant: LG ELECTRONICS INC., Seoul (KR)

(72) Inventors: Kokeun Kim, Seoul (KR); Suyeon Kim, Seoul (KR); Kamin Lee, Seoul (KR); Seungah Chae, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 264 days.

(21) Appl. No.: 16/944,034

(22) Filed: Jul. 30, 2020

(65) Prior Publication Data

US 2021/0064792 A1    Mar. 4, 2021

(30) Foreign Application Priority Data

Aug. 27, 2019    (KR) .......................... 10-2019-0105297

(51) Int. Cl.
*G06F 30/12*    (2020.01)
*G06N 3/08*    (2023.01)

(52) U.S. Cl.
CPC ............... *G06F 30/12* (2020.01); *G06N 3/08* (2013.01)

(58) Field of Classification Search
CPC .......... G06F 30/12; G06F 30/27; G06F 30/13; G06N 3/08; G06N 3/0445; G06N 3/0454; G06Q 10/043; G05D 1/0044; G09B 29/004

See application file for complete search history.

(56) References Cited

U.S. PATENT DOCUMENTS

| | | | |
|---|---|---|---|
| 2013/0222393 A1* | 8/2013 | Merrell | G06T 19/00 345/441 |
| 2017/0364924 A1* | 12/2017 | Bennett | G08B 17/10 |
| 2019/0147288 A1* | 5/2019 | Gupta | G06N 3/0454 715/253 |
| 2019/0164340 A1* | 5/2019 | Pejic | G06T 19/20 |
| 2019/0332110 A1* | 10/2019 | Isele | G06N 3/006 |
| 2020/0357256 A1* | 11/2020 | Wright | G08B 21/0423 |
| 2021/0164334 A1* | 6/2021 | Chen | E21B 44/005 |

* cited by examiner

*Primary Examiner* — Michael Roswell
(74) *Attorney, Agent, or Firm* — Lee, Hong, Degerman, Kang & Waimey PC

(57) ABSTRACT

The present invention includes an artificial intelligence device and a method for operating the same. The artificial intelligence device includes a communication unit that receives indoor area map data and indoor area image data from at least one external device, and a processor that generates first furniture placement map data in which a placement position of at least one piece of furniture is mapped, provides the first furniture placement map data to a furniture placement model, and obtains second furniture placement map data in which a placement position of at least one piece of furniture is changed, based on indoor area map data and indoor area image data.

14 Claims, 15 Drawing Sheets

ARTIFICIAL INTELLIGENCE DEVICE FOR GUIDING FURNITURE PLACEMENT AND METHOD OF OPERATING THE SAME

CROSS-REFERENCE TO RELATED APPLICATION

Pursuant to 35 U.S.C. § 119(a), this application claims the benefit of earlier filing date and right of priority to Korean Patent Application No. 10-2019-0105297, filed on Aug. 27, 2019, the contents of which are all hereby incorporated by reference herein in their entirety.

BACKGROUND OF THE INVENTION

1. Field of the Invention

The present invention relates to an artificial intelligence device for guiding furniture placement.

2. Discussion of the Related Art

Artificial intelligence (AI) refers to one field of computer engineering and information technology of studying a method for making a computer think, learn, and do self-improvement, which is achieved based on human intelligence, and means that a computer emulates an intelligent behavior of the human.

AI is largely related directly and indirectly to other fields of a computer science rather than existing itself. In particular, AI elements have been modernly introduced in various fields of information technology, and there has been an active attempt to use AI to overcome problems of the fields.

Research has been actively conducted into technology of recognizing and learning a surrounding situation using AI and providing information desired by a user in the desired form or performing an operation or function desired by the user.

An electronic device for providing such various operations and functions is referred to as an AI device.

Conventional indoor furniture placement has been often performed arbitrarily by the user, regardless of how much furniture interferes with a user's moving route or the user's gaze.

Therefore, there may occur a problem in that the user's moving route and gaze are limited depending on the placement positions of many pieces of furniture such as a sofa, a dining table and a table in rooms.

Accordingly, a method of placing furniture needs to be considered in consideration of the user's moving route and gaze.

SUMMARY OF THE INVENTION

The present invention is provided to solve the problems discussed above and other problems.

An object of the present invention is to provide an artificial intelligence device capable of guiding optimal furniture placement to consider a user's moving route in a room and secure the user's gaze.

Another object of the present invention is to provide an artificial intelligence device capable of guiding optimal furniture placement by reflecting a moving route of a user that changes in real time using driving data of a robot cleaner.

According to an embodiment of the present invention provides an artificial intelligence device which includes a communication unit that receives indoor area map data and indoor area image data from at least one external device, and a processor that generates first furniture placement map data in which a placement position of at least one piece of furniture is mapped, provides the first furniture placement map data to a furniture placement model, and obtains second furniture placement map data in which a placement position of at least one piece of furniture is changed, based on indoor area map data and indoor area image data.

Also, an embodiment of the present invention provides an artificial intelligence device capable of guiding change for current furniture placement based on moving route data received from an external device.

According to an embodiment of the present invention, a user may be guided to an optimal placement location of at least one piece of furniture. Accordingly, it is possible to optimize a moving route in a room and to secure the user's gaze when the furniture is placed in the room.

In addition, according to various embodiments of the present invention, it is possible to guide the optimal furniture placement in real time by arranging furniture in consideration of the moving line of the robot cleaner.

DETAILED DESCRIPTION OF THE PREFERRED EMBODIMENTS

Figure 1:
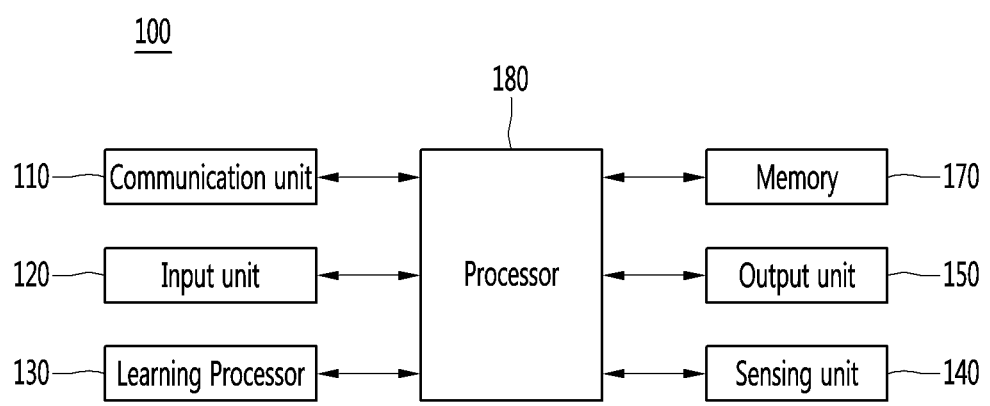
FIG. 1 illustrates an AI device 100 according to an embodiment of the present invention.

Hereinafter, embodiments of the present disclosure are described in more detail with reference to accompanying drawings and regardless of the drawings symbols, same or similar components are assigned with the same reference numerals and thus overlapping descriptions for those are omitted. The suffixes "module" and "unit" for components used in the description below are assigned or mixed in consideration of easiness in writing the specification and do not have distinctive meanings or roles by themselves. In the following description, detailed descriptions of well-known functions or constructions will be omitted since they would obscure the invention in unnecessary detail. Additionally, the accompanying drawings are used to help easily understanding embodiments disclosed herein but the technical idea of the present disclosure is not limited thereto. It should be understood that all of variations, equivalents or substitutes contained in the concept and technical scope of the present disclosure are also included.

It will be understood that the terms "first" and "second" are used herein to describe various components but these components should not be limited by these terms. These terms are used only to distinguish one component from other components.

In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). It will be further understood that when one component is referred to as being 'directly connected' or 'directly linked' to another component, it means that no intervening component is present.

<Artificial Intelligence (AI)>

Artificial intelligence refers to the field of studying artificial intelligence or methodology for making artificial intelligence, and machine learning refers to the field of defining various issues dealt with in the field of artificial intelligence and studying methodology for solving the various issues. Machine learning is defined as an algorithm that enhances the performance of a certain task through a steady experience with the certain task.

An artificial neural network (ANN) is a model used in machine learning and may mean a whole model of problem-solving ability which is composed of artificial neurons (nodes) that form a network by synaptic connections. The artificial neural network can be defined by a connection pattern between neurons in different layers, a learning process for updating model parameters, and an activation function for generating an output value.

The artificial neural network may include an input layer, an output layer, and optionally one or more hidden layers. Each layer includes one or more neurons, and the artificial neural network may include a synapse that links neurons to neurons. In the artificial neural network, each neuron may output the function value of the activation function for input signals, weights, and deflections input through the synapse.

Model parameters refer to parameters determined through learning and include a weight value of synaptic connection and deflection of neurons. A hyperparameter means a parameter to be set in the machine learning algorithm before learning, and includes a learning rate, a repetition number, a mini batch size, and an initialization function.

The purpose of the learning of the artificial neural network may be to determine the model parameters that minimize a loss function. The loss function may be used as an index to determine optimal model parameters in the learning process of the artificial neural network.

Machine learning may be classified into supervised learning, unsupervised learning, and reinforcement learning according to a learning method.

The supervised learning may refer to a method of learning an artificial neural network in a state in which a label for learning data is given, and the label may mean the correct answer (or result value) that the artificial neural network must infer when the learning data is input to the artificial neural network. The unsupervised learning may refer to a method of learning an artificial neural network in a state in which a label for learning data is not given. The reinforcement learning may refer to a learning method in which an agent defined in a certain environment learns to select a behavior or a behavior sequence that maximizes cumulative compensation in each state.

Machine learning, which is implemented as a deep neural network (DNN) including a plurality of hidden layers among artificial neural networks, is also referred to as deep learning, and the deep learning is part of machine learning. In the following, machine learning is used to mean deep learning.

<Robot>

A robot may refer to a machine that automatically processes or operates a given task by its own ability. In particular, a robot having a function of recognizing an environment and performing a self-determination operation may be referred to as an intelligent robot.

Robots may be classified into industrial robots, medical robots, home robots, military robots, and the like according to the use purpose or field.

The robot includes a driving unit may include an actuator or a motor and may perform various physical operations such as moving a robot joint. In addition, a movable robot may include a wheel, a brake, a propeller, and the like in a driving unit, and may travel on the ground through the driving unit or fly in the air.

<Self-Driving>

Self-driving refers to a technique of driving for oneself, and a self-driving vehicle refers to a vehicle that travels without an operation of a user or with a minimum operation of a user.

For example, the self-driving may include a technology for maintaining a lane while driving, a technology for automatically adjusting a speed, such as adaptive cruise control, a technique for automatically traveling along a predetermined route, and a technology for automatically setting and traveling a route when a destination is set.

The vehicle may include a vehicle having only an internal combustion engine, a hybrid vehicle having an internal combustion engine and an electric motor together, and an electric vehicle having only an electric motor, and may include not only an automobile but also a train, a motorcycle, and the like.

At this time, the self-driving vehicle may be regarded as a robot having a self-driving function.

<eXtended Reality (XR)>

Extended reality is collectively referred to as virtual reality (VR), augmented reality (AR), and mixed reality (MR). The VR technology provides a real-world object and background only as a CG image, the AR technology provides a virtual CG image on a real object image, and the MR technology is a computer graphic technology that mixes and combines virtual objects into the real world.

The MR technology is similar to the AR technology in that the real object and the virtual object are shown together. However, in the AR technology, the virtual object is used in the form that complements the real object, whereas in the MR technology, the virtual object and the real object are used in an equal manner.

The XR technology may be applied to a head-mount display (HMD), a head-up display (HUD), a mobile phone, a tablet PC, a laptop, a desktop, a TV, a digital signage, and the like. A device to which the XR technology is applied may be referred to as an XR device.

FIG. 1 illustrates an AI device 100 according to an embodiment of the present invention.

The AI device (or an AI apparatus) 100 may be implemented by a stationary device or a mobile device, such as a TV, a projector, a mobile phone, a smartphone, a desktop computer, a notebook, a digital broadcasting terminal, a personal digital assistant (PDA), a portable multimedia player (PMP), a navigation device, a tablet PC, a wearable device, a set-top box (STB), a DMB receiver, a radio, a washing machine, a refrigerator, a desktop computer, a digital signage, a robot, a vehicle, and the like.

Referring to FIG. 1, the AI device 100 may include a communication unit 110, an input unit 120, a learning processor 130, a sensing unit 140, an output unit 150, a memory 170, and a processor 180.

The communication unit 110 may transmit and receive data to and from external devices such as other AI devices 100a to 100e and the AI server 200 by using wire/wireless communication technology. For example, the communication unit 110 may transmit and receive sensor information, a user input, a learning model, and a control signal to and from external devices.

The communication technology used by the communication unit 110 includes GSM (Global System for Mobile communication), CDMA (Code Division Multi Access), LTE (Long Term Evolution), 5G, WLAN (Wireless LAN), Wi-Fi (Wireless-Fidelity), Bluetooth™, RFID (Radio Frequency Identification), Infrared Data Association (IrDA), ZigBee, NFC (Near Field Communication), and the like.

The input unit 120 may acquire various kinds of data. At this time, the input unit 120 may include a camera for inputting a video signal, a microphone for receiving an audio signal, and a user input unit for receiving information from a user. The camera or the microphone may be treated as a sensor, and the signal acquired from the camera or the microphone may be referred to as sensing data or sensor information.

The input unit 120 may acquire a learning data for model learning and an input data to be used when an output is acquired by using learning model. The input unit 120 may acquire raw input data. In this case, the processor 180 or the learning processor 130 may extract an input feature by preprocessing the input data.

The learning processor 130 may learn a model composed of an artificial neural network by using learning data. The learned artificial neural network may be referred to as a learning model. The learning model may be used to an infer result value for new input data rather than learning data, and the inferred value may be used as a basis for determination to perform a certain operation.

At this time, the learning processor 130 may perform AI processing together with the learning processor 240 of the AI server 200.

At this time, the learning processor 130 may include a memory integrated or implemented in the AI device 100. Alternatively, the learning processor 130 may be implemented by using the memory 170, an external memory directly connected to the AI device 100, or a memory held in an external device.

The sensing unit 140 may acquire at least one of internal information about the AI device 100, ambient environment information about the AI device 100, and user information by using various sensors.

Examples of the sensors included in the sensing unit 140 may include a proximity sensor, an illuminance sensor, an acceleration sensor, a magnetic sensor, a gyro sensor, an inertial sensor, an RGB sensor, an IR sensor, a fingerprint recognition sensor, an ultrasonic sensor, an optical sensor, a microphone, a lidar, and a radar.

The output unit 150 may generate an output related to a visual sense, an auditory sense, or a haptic sense.

At this time, the output unit 150 may include a display unit for outputting time information, a speaker for outputting auditory information, and a haptic module for outputting haptic information.

The memory 170 may store data that supports various functions of the AI device 100. For example, the memory 170 may store input data acquired by the input unit 120, learning data, a learning model, a learning history, and the like.

The processor 180 may determine at least one executable operation of the AI device 100 based on information determined or generated by using a data analysis algorithm or a machine learning algorithm. The processor 180 may control the components of the AI device 100 to execute the determined operation.

To this end, the processor 180 may request, search, receive, or utilize data of the learning processor 130 or the memory 170. The processor 180 may control the components of the AI device 100 to execute the predicted operation or the operation determined to be desirable among the at least one executable operation.

When the connection of an external device is required to perform the determined operation, the processor 180 may generate a control signal for controlling the external device and may transmit the generated control signal to the external device.

The processor 180 may acquire intention information for the user input and may determine the user's requirements based on the acquired intention information.

The processor 180 may acquire the intention information corresponding to the user input by using at least one of a speech to text (STT) engine for converting speech input into a text string or a natural language processing (NLP) engine for acquiring intention information of a natural language.

At least one of the STT engine or the NLP engine may be configured as an artificial neural network, at least part of which is learned according to the machine learning algorithm. At least one of the STT engine or the NLP engine may be learned by the learning processor 130, may be learned by the learning processor 240 of the AI server 200, or may be learned by their distributed processing.

The processor 180 may collect history information including the operation contents of the AI apparatus 100 or the user's feedback on the operation and may store the collected history information in the memory 170 or the learning processor 130 or transmit the collected history information to the external device such as the AI server 200. The collected history information may be used to update the learning model.

The processor 180 may control at least part of the components of AI device 100 so as to drive an application program stored in memory 170. Furthermore, the processor 180 may operate two or more of the components included in the AI device 100 in combination so as to drive the application program.

Figure 2:
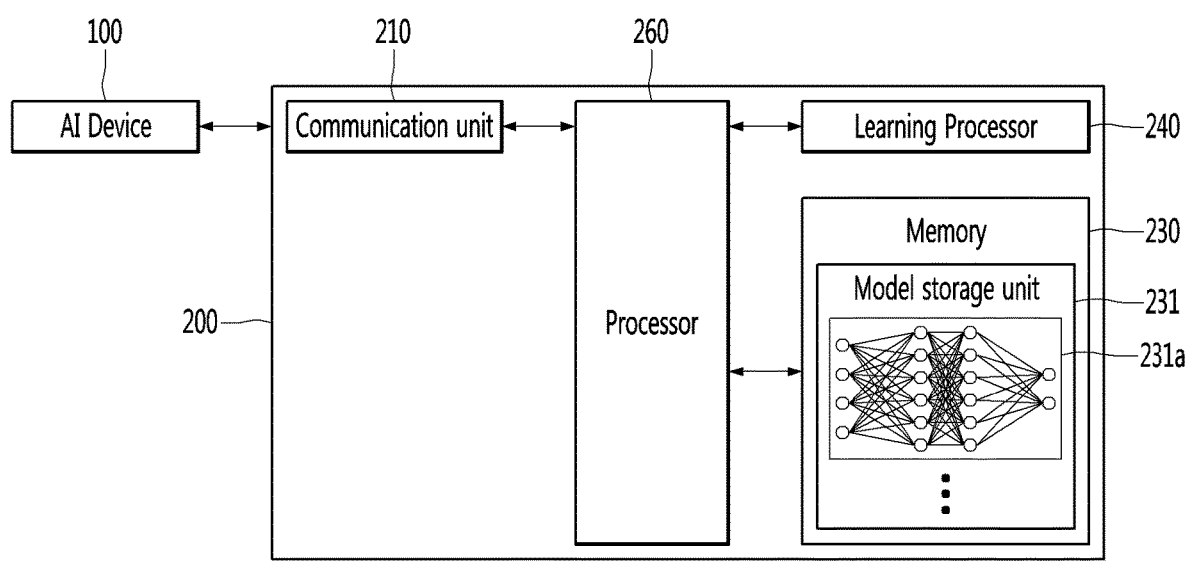
FIG. 2 illustrates an AI server 200 according to an embodiment of the present invention.

FIG. 2 illustrates an AI server 200 according to an embodiment of the present invention.

Referring to FIG. 2, the AI server 200 may refer to a device that learns an artificial neural network by using a machine learning algorithm or uses a learned artificial neural network. The AI server 200 may include a plurality of servers to perform distributed processing, or may be defined as a 5G network. At this time, the AI server 200 may be included as a partial configuration of the AI device 100, and may perform at least part of the AI processing together.

The AI server 200 may include a communication unit 210, a memory 230, a learning processor 240, a processor 260, and the like.

The communication unit 210 can transmit and receive data to and from an external device such as the AI device 100.

The memory 230 may include a model storage unit 231. The model storage unit 231 may store a learning or learned model (or an artificial neural network 231a) through the learning processor 240.

The learning processor 240 may learn the artificial neural network 231a by using the learning data. The learning model may be used in a state of being mounted on the AI server 200 of the artificial neural network, or may be used in a state of being mounted on an external device such as the AI device 100.

The learning model may be implemented in hardware, software, or a combination of hardware and software. If all or part of the learning models are implemented in software, one or more instructions that constitute the learning model may be stored in memory 230.

The processor 260 may infer the result value for new input data by using the learning model and may generate a response or a control command based on the inferred result value.

Figure 3:
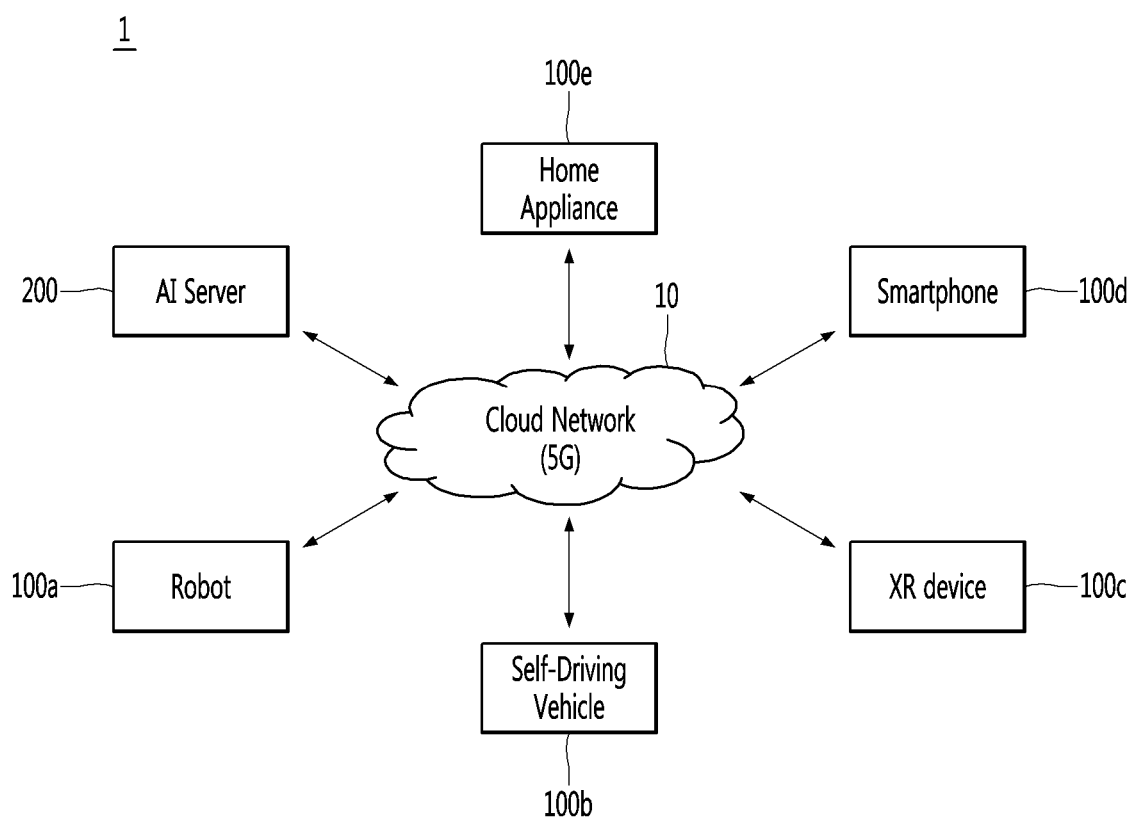
FIG. 3 illustrates an AI system 1 according to an embodiment of the present invention.

FIG. 3 illustrates an AI system 1 according to an embodiment of the present invention.

Referring to FIG. 3, in the AI system 1, at least one of an AI server 200, a robot 100a, a self-driving vehicle 100b, an XR device 100c, a smartphone 100d, or a home appliance 100e is connected to a cloud network 10. The robot 100a, the self-driving vehicle 100b, the XR device 100c, the smartphone 100d, or the home appliance 100e, to which the AI technology is applied, may be referred to as AI devices 100a to 100e.

The cloud network 10 may refer to a network that forms part of a cloud computing infrastructure or exists in a cloud computing infrastructure. The cloud network 10 may be configured by using a 3G network, a 4G or LTE network, or a 5G network.

That is, the devices 100a to 100e and 200 configuring the AI system 1 may be connected to each other through the cloud network 10. In particular, each of the devices 100a to 100e and 200 may communicate with each other through a base station, but may directly communicate with each other without using a base station.

The AI server 200 may include a server that performs AI processing and a server that performs operations on big data.

The AI server 200 may be connected to at least one of the AI devices constituting the AI system 1, that is, the robot 100a, the self-driving vehicle 100b, the XR device 100c, the smartphone 100d, or the home appliance 100e through the cloud network 10, and may assist at least part of AI processing of the connected AI devices 100a to 100e.

At this time, the AI server 200 may learn the artificial neural network according to the machine learning algorithm instead of the AI devices 100a to 100e, and may directly store the learning model or transmit the learning model to the AI devices 100a to 100e.

At this time, the AI server 200 may receive input data from the AI devices 100a to 100e, may infer the result value for the received input data by using the learning model, may generate a response or a control command based on the inferred result value, and may transmit the response or the control command to the AI devices 100a to 100e.

Alternatively, the AI devices 100a to 100e may infer the result value for the input data by directly using the learning model, and may generate the response or the control command based on the inference result.

Hereinafter, various embodiments of the AI devices 100a to 100e to which the above-described technology is applied will be described. The AI devices 100a to 100e illustrated in FIG. 3 may be regarded as a specific embodiment of the AI device 100 illustrated in FIG. 1.

<AI+Robot>

The robot 100a, to which the AI technology is applied, may be implemented as a guide robot, a carrying robot, a cleaning robot, a wearable robot, an entertainment robot, a pet robot, an unmanned flying robot, or the like.

The robot 100a may include a robot control module for controlling the operation, and the robot control module may refer to a software module or a chip implementing the software module by hardware.

The robot 100a may acquire state information about the robot 100a by using sensor information acquired from various kinds of sensors, may detect (recognize) surrounding environment and objects, may generate map data, may determine the route and the travel plan, may determine the response to user interaction, or may determine the operation.

The robot 100a may use the sensor information acquired from at least one sensor among the lidar, the radar, and the camera so as to determine the travel route and the travel plan.

The robot 100a may perform the above-described operations by using the learning model composed of at least one artificial neural network. For example, the robot 100a may recognize the surrounding environment and the objects by using the learning model, and may determine the operation by using the recognized surrounding information or object information. The learning model may be learned directly from the robot 100a or may be learned from an external device such as the AI server 200.

At this time, the robot 100a may perform the operation by generating the result by directly using the learning model, but the sensor information may be transmitted to the external device such as the AI server 200 and the generated result may be received to perform the operation.

The robot 100a may use at least one of the map data, the object information detected from the sensor information, or the object information acquired from the external apparatus to determine the travel route and the travel plan, and may control the driving unit such that the robot 100a travels along the determined travel route and travel plan.

The map data may include object identification information about various objects arranged in the space in which the robot 100a moves. For example, the map data may include object identification information about fixed objects such as walls and doors and movable objects such as pollen and desks. The object identification information may include a name, a type, a distance, and a position.

In addition, the robot 100a may perform the operation or travel by controlling the driving unit based on the control/interaction of the user. At this time, the robot 100a may acquire the intention information of the interaction due to the user's operation or speech utterance, and may determine the response based on the acquired intention information, and may perform the operation.

<AI+Self-Driving>

The self-driving vehicle 100b, to which the AI technology is applied, may be implemented as a mobile robot, a vehicle, an unmanned flying vehicle, or the like.

The self-driving vehicle 100b may include a self-driving control module for controlling a self-driving function, and the self-driving control module may refer to a software module or a chip implementing the software module by hardware. The self-driving control module may be included in the self-driving vehicle 100b as a component thereof, but may be implemented with separate hardware and connected to the outside of the self-driving vehicle 100b.

The self-driving vehicle 100b may acquire state information about the self-driving vehicle 100b by using sensor information acquired from various kinds of sensors, may detect (recognize) surrounding environment and objects, may generate map data, may determine the route and the travel plan, or may determine the operation.

Like the robot 100a, the self-driving vehicle 100b may use the sensor information acquired from at least one sensor among the lidar, the radar, and the camera so as to determine the travel route and the travel plan.

In particular, the self-driving vehicle 100b may recognize the environment or objects for an area covered by a field of view or an area over a certain distance by receiving the sensor information from external devices, or may receive directly recognized information from the external devices.

The self-driving vehicle 100b may perform the above-described operations by using the learning model composed of at least one artificial neural network. For example, the self-driving vehicle 100b may recognize the surrounding environment and the objects by using the learning model, and may determine the traveling movement line by using the recognized surrounding information or object information. The learning model may be learned directly from the self-driving vehicle 100a or may be learned from an external device such as the AI server 200.

At this time, the self-driving vehicle 100b may perform the operation by generating the result by directly using the learning model, but the sensor information may be transmitted to the external device such as the AI server 200 and the generated result may be received to perform the operation.

The self-driving vehicle 100b may use at least one of the map data, the object information detected from the sensor information, or the object information acquired from the external apparatus to determine the travel route and the travel plan, and may control the driving unit such that the self-driving vehicle 100b travels along the determined travel route and travel plan.

The map data may include object identification information about various objects arranged in the space (for example, road) in which the self-driving vehicle 100b travels. For example, the map data may include object identification information about fixed objects such as street lamps, rocks, and buildings and movable objects such as vehicles and pedestrians. The object identification information may include a name, a type, a distance, and a position.

In addition, the self-driving vehicle 100b may perform the operation or travel by controlling the driving unit based on the control/interaction of the user. At this time, the self-driving vehicle 100b may acquire the intention information of the interaction due to the user's operation or speech utterance, and may determine the response based on the acquired intention information, and may perform the operation.

<AI+XR>

The XR device 100c, to which the AI technology is applied, may be implemented by a head-mount display (HMD), a head-up display (HUD) provided in the vehicle, a television, a mobile phone, a smartphone, a computer, a wearable device, a home appliance, a digital signage, a vehicle, a fixed robot, a mobile robot, or the like.

The XR device 100c may analyzes three-dimensional point cloud data or image data acquired from various sensors or the external devices, generate position data and attribute data for the three-dimensional points, acquire information about the surrounding space or the real object, and render to output the XR object to be output. For example, the XR device 100c may output an XR object including the additional information about the recognized object in correspondence to the recognized object.

The XR device 100c may perform the above-described operations by using the learning model composed of at least one artificial neural network. For example, the XR device 100c may recognize the real object from the three-dimensional point cloud data or the image data by using the learning model, and may provide information corresponding to the recognized real object. The learning model may be directly learned from the XR device 100c, or may be learned from the external device such as the AI server 200.

At this time, the XR device 100c may perform the operation by generating the result by directly using the learning model, but the sensor information may be transmitted to the external device such as the AI server 200 and the generated result may be received to perform the operation.

<AI+Robot+Self-Driving>

The robot 100a, to which the AI technology and the self-driving technology are applied, may be implemented as a guide robot, a carrying robot, a cleaning robot, a wearable robot, an entertainment robot, a pet robot, an unmanned flying robot, or the like.

The robot 100a, to which the AI technology and the self-driving technology are applied, may refer to the robot itself having the self-driving function or the robot 100a interacting with the self-driving vehicle 100b.

The robot 100a having the self-driving function may collectively refer to a device that moves for itself along the given movement line without the user's control or moves for itself by determining the movement line by itself.

The robot 100a and the self-driving vehicle 100b having the self-driving function may use a common sensing method so as to determine at least one of the travel route or the travel plan. For example, the robot 100a and the self-driving vehicle 100b having the self-driving function may determine at least one of the travel route or the travel plan by using the information sensed through the lidar, the radar, and the camera.

The robot 100a that interacts with the self-driving vehicle 100b exists separately from the self-driving vehicle 100b and may perform operations interworking with the self-driving function of the self-driving vehicle 100b or interworking with the user who rides on the self-driving vehicle 100b.

At this time, the robot 100a interacting with the self-driving vehicle 100b may control or assist the self-driving function of the self-driving vehicle 100b by acquiring sensor information on behalf of the self-driving vehicle 100b and providing the sensor information to the self-driving vehicle 100b, or by acquiring sensor information, generating environment information or object information, and providing the information to the self-driving vehicle 100b.

Alternatively, the robot 100a interacting with the self-driving vehicle 100b may monitor the user boarding the self-driving vehicle 100b, or may control the function of the self-driving vehicle 100b through the interaction with the user. For example, when it is determined that the driver is in a drowsy state, the robot 100a may activate the self-driving function of the self-driving vehicle 100b or assist the control of the driving unit of the self-driving vehicle 100b. The function of the self-driving vehicle 100b controlled by the robot 100a may include not only the self-driving function but also the function provided by the navigation system or the audio system provided in the self-driving vehicle 100b.

Alternatively, the robot 100a that interacts with the self-driving vehicle 100b may provide information or assist the function to the self-driving vehicle 100b outside the self-driving vehicle 100b. For example, the robot 100a may provide traffic information including signal information and the like, such as a smart signal, to the self-driving vehicle 100b, and automatically connect an electric charger to a charging port by interacting with the self-driving vehicle 100b like an automatic electric charger of an electric vehicle.

<AI+Robot+XR>

The robot 100a, to which the AI technology and the XR technology are applied, may be implemented as a guide robot, a carrying robot, a cleaning robot, a wearable robot, an entertainment robot, a pet robot, an unmanned flying robot, a drone, or the like.

The robot 100a, to which the XR technology is applied, may refer to a robot that is subjected to control/interaction in an XR image. In this case, the robot 100a may be separated from the XR device 100c and interwork with each other.

When the robot 100a, which is subjected to control/interaction in the XR image, may acquire the sensor information from the sensors including the camera, the robot 100a or the XR device 100c may generate the XR image based on the sensor information, and the XR device 100c may output the generated XR image. The robot 100a may operate based on the control signal input through the XR device 100c or the user's interaction.

For example, the user can confirm the XR image corresponding to the time point of the robot 100a interworking remotely through the external device such as the XR device 100c, adjust the self-driving travel path of the robot 100a through interaction, control the operation or driving, or confirm the information about the surrounding object.

<AI+Self-Driving+XR>

The self-driving vehicle 100b, to which the AI technology and the XR technology are applied, may be implemented as a mobile robot, a vehicle, an unmanned flying vehicle, or the like.

The self-driving driving vehicle 100b, to which the XR technology is applied, may refer to a self-driving vehicle having a means for providing an XR image or a self-driving vehicle that is subjected to control/interaction in an XR image. Particularly, the self-driving vehicle 100b that is subjected to control/interaction in the XR image may be distinguished from the XR device 100c and interwork with each other.

The self-driving vehicle 100b having the means for providing the XR image may acquire the sensor information from the sensors including the camera and output the generated XR image based on the acquired sensor information. For example, the self-driving vehicle 100b may include an HUD to output an XR image, thereby providing a passenger with a real object or an XR object corresponding to an object in the screen.

At this time, when the XR object is output to the HUD, at least part of the XR object may be outputted so as to overlap the actual object to which the passenger's gaze is directed. Meanwhile, when the XR object is output to the display provided in the self-driving vehicle 100b, at least part of the XR object may be output so as to overlap the object in the screen. For example, the self-driving vehicle 100b may output XR objects corresponding to objects such as a lane, another vehicle, a traffic light, a traffic sign, a two-wheeled vehicle, a pedestrian, a building, and the like.

When the self-driving vehicle 100b, which is subjected to control/interaction in the XR image, may acquire the sensor information from the sensors including the camera, the self-driving vehicle 100b or the XR device 100c may generate the XR image based on the sensor information, and the XR device 100c may output the generated XR image. The self-driving vehicle 100b may operate based on the control signal input through the external device such as the XR device 100c or the user's interaction.

First, artificial intelligence (AI) will be described briefly.

Artificial intelligence (AI) is one field of computer engineering and information technology for studying a method of enabling a computer to perform thinking, learning, and self-development that can be performed by human intelligence and may denote that a computer imitates an intelligent action of a human.

Moreover, AI is directly/indirectly associated with the other field of computer engineering without being individually provided. Particularly, at present, in various fields of information technology, an attempt to introduce AI components and use the AI components in solving a problem of a corresponding field is being actively done.

Machine learning is one field of AI and is a research field which enables a computer to perform learning without an explicit program.

In detail, machine learning may be technology which studies and establishes a system for performing learning based on experiential data, performing prediction, and autonomously enhancing performance and algorithms relevant thereto. Algorithms of machine learning may use a method which establishes a specific model for obtaining prediction or decision on the basis of input data, rather than a method of executing program instructions which are strictly predefined.

The term "machine learning" may be referred to as "machine learning".

In machine learning, a number of machine learning algorithms for classifying data have been developed. Decision tree, Bayesian network, support vector machine (SVM), and artificial neural network (ANN) are representative examples of the machine learning algorithms.

The decision tree is an analysis method of performing classification and prediction by schematizing a decision rule into a tree structure.

The Bayesian network is a model where a probabilistic relationship (conditional independence) between a plurality of variables is expressed as a graph structure. The Bayesian network is suitable for data mining based on unsupervised learning.

The SVM is a model of supervised learning for pattern recognition and data analysis and is mainly used for classification and regression.

The ANN is a model which implements the operation principle of biological neuron and a connection relationship between neurons and is an information processing system where a plurality of neurons called nodes or processing elements are connected to one another in the form of a layer structure.

The ANN is a model used for machine learning and is a statistical learning algorithm inspired from a neural network (for example, brains in a central nervous system of animals) of biology in machine learning and cognitive science.

In detail, the ANN may denote all models where an artificial neuron (a node) of a network which is formed through a connection of synapses varies a connection strength of synapses through learning, thereby obtaining an ability to solve problems.

The term "ANN" may be referred to as "neural network". The ANN may include a plurality of layers, and each of the plurality of layers may include a plurality of neurons. Also, the ANN may include a synapse connecting a neuron to another neuron.

The ANN may be generally defined by the following factors: (1) a connection pattern between neurons of a different layer; (2) a learning process of updating a weight of a connection; and (3) an activation function for generating an output value from a weighted sum of inputs received from a previous layer.

The ANN may include network models such as a deep neural network (DNN), a recurrent neural network (RNN), a bidirectional recurrent deep neural network (BRDNN), a multilayer perceptron (MLP), and a convolutional neural network (CNN), but is not limited thereto.

In this specification, the term "layer" may be referred to as "layer".

The ANN may be categorized into single layer neural networks and multilayer neural networks, based on the number of layers.

General single layer neural networks is configured with an input layer and an output layer.

Moreover, general multilayer neural networks is configured with an input layer, at least one hidden layer, and an output layer.

The input layer is a layer which receives external data, and the number of neurons of the input layer is the same the number of input variables, and the hidden layer is located between the input layer and the output layer and receives a signal from the input layer to extract a characteristic from the received signal and may transfer the extracted characteristic to the output layer. The output layer receives a signal from the hidden layer and outputs an output value based on the received signal. An input signal between neurons may be multiplied by each connection strength (weight), and values obtained through the multiplication may be summated. When the sum is greater than a threshold value of a neuron, the neuron may be activated and may output an output value obtained through an activation function.

The DNN including a plurality of hidden layers between an input layer and an output layer may be a representative ANN which implements deep learning which is a kind of machine learning technology.

The term "deep learning" may be referred to as "deep learning".

The ANN may be trained by using training data. Here, training may denote a process of determining a parameter of the ANN, for achieving purposes such as classifying, regressing, or clustering input data. A representative example of a parameter of the ANN may include a weight assigned to a synapse or a bias applied to a neuron.

An ANN trained based on training data may classify or cluster input data, based on a pattern of the input data.

In this specification, an ANN trained based on training data may be referred to as a trained model.

Next, a learning method of an ANN will be described.

The learning method of the ANN may be largely classified into supervised learning, unsupervised learning, semi-supervised learning, and reinforcement learning.

The supervised learning may be a method of machine learning for analogizing one function from training data.

Moreover, in analogized functions, a function of outputting continual values may be referred to as regression, and a function of predicting and outputting a class of an input vector may be referred to as classification.

In the supervised learning, an ANN may be trained in a state where a label of training data is assigned.

Here, the label may denote a right answer (or a result value) to be inferred by an ANN when training data is input to the ANN.

In this specification, a right answer (or a result value) to be inferred by an ANN when training data is input to the ANN may be referred to as a label or labeling data.

Moreover, in this specification, a process of assigning a label to training data for learning of an ANN may be referred to as a process which labels labeling data to training data.

In this case, training data and a label corresponding to the training data may configure one training set and may be inputted to an ANN in the form of training sets.

Training data may represent a plurality of features, and a label being labeled to training data may denote that the label is assigned to a feature represented by the training data. In this case, the training data may represent a feature of an input object as a vector type.

An ANN may analogize a function corresponding to an association relationship between training data and labeling data by using the training data and the labeling data. Also, a parameter of the ANN may be determined (optimized) through evaluating the analogized function.

The unsupervised learning is a kind of machine learning, and in this case, a label may not be assigned to training data.

In detail, the unsupervised learning may be a learning method of training an ANN so as to detect a pattern from training data itself and classify the training data, rather than to detect an association relationship between the training data and a label corresponding to the training data.

Examples of the unsupervised learning may include clustering and independent component analysis.

In this specification, the term "clustering" may be referred to as "clustering".

Examples of an ANN using the unsupervised learning may include a generative adversarial network (GAN) and an autoencoder (AE).

The GAN is a method of improving performance through competition between two different AIs called a generator and a discriminator.

In this case, the generator is a model for creating new data and generates new data, based on original data.

Moreover, the discriminator is a model for recognizing a pattern of data and determines whether inputted data is original data or fake data generated from the generator.

Moreover, the generator may be trained by receiving and using data which does not deceive the discriminator, and the discriminator may be trained by receiving and using deceived data generated by the generator. Therefore, the generator may evolve so as to deceive the discriminator as much as possible, and the discriminator may evolve so as to distinguish original data from data generated by the generator.

The AE is a neural network for reproducing an input as an output.

The AE may include an input layer, at least one hidden layer, and an output layer.

In this case, the number of node of the hidden layer may be smaller than the number of nodes of the input layer, and thus, a dimension of data may be reduced, whereby compression or encoding may be performed.

Moreover, data outputted from the hidden layer may enter the output layer. In this case, the number of nodes of the output layer may be larger than the number of nodes of the hidden layer, and thus, a dimension of the data may increase, and thus, decompression or decoding may be performed.

The AE may control the connection strength of a neuron through learning, and thus, input data may be expressed as hidden layer data. In the hidden layer, information may be expressed by using a smaller number of neurons than those of the input layer, and input data being reproduced as an output may denote that the hidden layer detects and expresses a hidden pattern from the input data.

The semi-supervised learning is a kind of machine learning and may denote a learning method which uses both training data with a label assigned thereto and training data with no label assigned thereto.

As a type of semi-supervised learning technique, there is a technique which infers a label of training data with no label assigned thereto and performs learning by using the inferred label, and such a technique may be usefully used for a case where the cost expended in labeling is large.

The reinforcement learning may be a theory where, when an environment where an agent is capable of determining an action to take at every moment is provided, the best way is obtained through experience without data.

The reinforcement learning may be performed by a Markov decision process (MDP).

To describe the MDP, firstly an environment where pieces of information needed for taking a next action of an agent may be provided, secondly an action which is to be taken by the agent in the environment may be defined, thirdly a reward provided based on a good action of the agent and a penalty provided based on a poor action of the agent may be defined, and fourthly an optimal policy may be derived through experience which is repeated until a future reward reaches a highest score.

An artificial neural network has a configuration that is specified by a configuration of a model, an activation function, a loss function or a cost function, a learning algorithm, an optimization algorithm, or the like, a hyperparameter may be preset before learning, and then, a model parameter may be set through learning to specify information.

For example, a factor for determining a configuration of the artificial neural network may include the number of hidden layers, the number of hidden nodes included in each hidden layer, an input feature vector, a target feature vector, or the like.

The hyperparameter may include various parameters that need to be initially set for learning, such as an initial value of the model parameter. The model parameter may include various parameters to be determined through learning.

For example, the hyperparameter may include a weight initial value between nodes, a bias initial value between nodes, a size of mini-batch, a number of repetitions of learning, a learning rate, or the like. The model parameter may include a weight between nodes, bias between nodes, or the like.

The loss function can be used for an index (reference) for determining optimum model parameters in a training process of an artificial neural network. In an artificial neural network, training means a process of adjusting model parameters to reduce the loss function and the object of training can be considered as determining model parameters that minimize the loss function.

The loss function may mainly use mean square error (MSE) or cross entropy error (CEE), but the present invention is not limited thereto.

The CEE may be used when a correct answer label is one-hot encoded. One-hot encoding is an encoding method for setting a correct answer label value to 1 for only neurons corresponding to a correct answer and setting a correct answer label to 0 for neurons corresponding to a wrong answer.

A learning optimization algorithm may be used to minimize a loss function in machine learning or deep learning, as the learning optimization algorithm, there are Gradient Descent (GD), Stochastic Gradient Descent (SGD), Momentum, NAG (Nesterov Accelerate Gradient), Adagrad, AdaDelta, RMSProp, Adam, and Nadam.

The GD is a technique that adjusts model parameters such that a loss function value decreases in consideration of the gradient of a loss function in the current state. The direction of adjusting model parameters is referred to as a step direction and the size of adjustment is referred to as a step size.

In this case, the step size may refer to a learning rate.

The GD may partially differentiate the loss function with each of model parameters to acquire gradients and may change and update the model parameters by the learning rate in the acquired gradient direction.

The SGD is a technique that increases the frequency of gradient descent by dividing training data into mini-batches and performing the GD for each of the mini-batches.

The Adagrad, AdaDelta, and RMSProp in the SGD are techniques that increase optimization accuracy by adjusting the step size. The momentum and the NAG in the SGD are techniques that increase optimization accuracy by adjusting the step direction. The Adam is a technique that increases optimization accuracy by adjusting the step size and the step direction by combining the momentum and the RMSProp. The Nadam is a technique that increases optimization accuracy by adjusting the step size and the step direction by combining the NAG and the RMSProp.

The learning speed and accuracy of an artificial neural network greatly depends on not only the structure of the artificial neural network and the kind of a learning optimization algorithm, but the hyperparameters. Accordingly, in order to acquire a good trained model, it is important not only to determine a suitable structure of an artificial neural network, but also to set suitable hyperparameters.

In general, hyperparameters are experimentally set to various values to train an artificial neural network, and are set to optimum values that provide stable learning speed and accuracy using training results.

Figure 4:
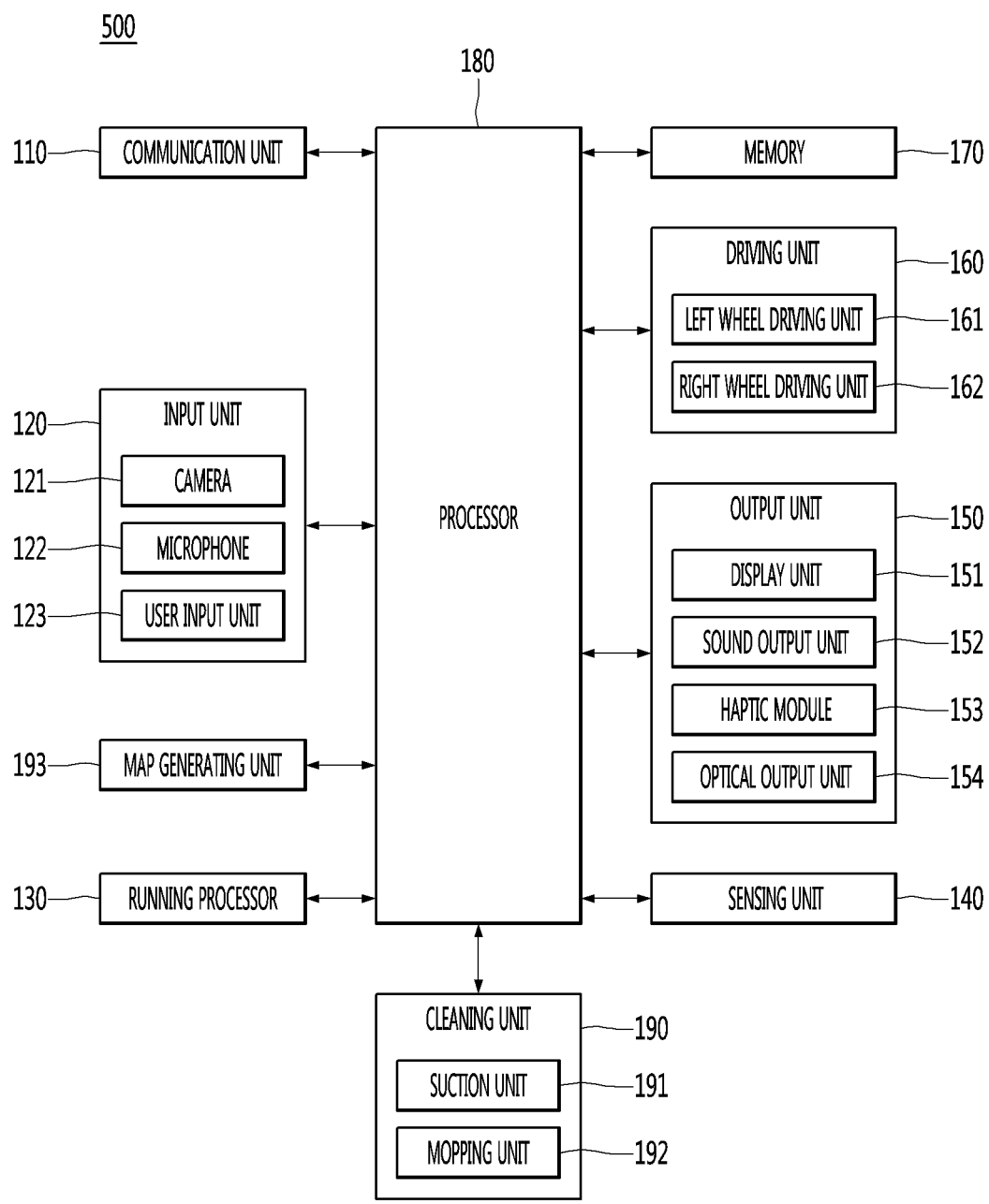
FIG. 4 illustrates a robot cleaner 500 according to an embodiment of the present invention.

FIG. 4 illustrates a robot cleaner 500 according to an embodiment of the present invention.

A description overlapping the description given with reference to FIG. 1 will be omitted.

Referring to FIG. 4, the robot cleaner 500 may further include a driving unit 160, a cleaning unit 190, and a map generating unit 193.

The input unit 120 may include a camera 121 for inputting an image signal, a microphone 122 for receiving an audio signal, and a user input unit 123 for receiving information from a user.

The speech data or image data collected by the input unit 120 may be analyzed and processed as a control command of the user.

The input unit 120 is for inputting image information (or signal), audio information (or signal), data, or information input from a user. In order to input image information, the robot cleaner 500 may include one or a plurality of cameras 121.

The camera 121 processes image frames such as still images or moving images obtained by an image sensor in a video call mode or a photographing mode. The processed image frames may be displayed on the display unit 151 or stored in the memory 170.

The microphone 122 processes external sound signals as electrical speech data. The processed speech data may be utilized in various ways according to a function (or a running application program) being performed in the robot cleaner 500. Meanwhile, various noise reduction algorithms may be applied in the microphone 122 to remove noise occurring in the process of receiving an external sound signal.

The user input unit 123 is for receiving information from a user. When information is input through the user input unit 123, the processor 180 may control the operation of the robot cleaner 500 to correspond to the input information when the information is inputted through the user input unit 123.

The user input unit 123 may include mechanical input means (or a mechanical key, for example, a button, a dome switch, a jog wheel, or a jog switch located at the front/rear or side of the robot cleaner 500) and touch input means. As an example, the touch input means may include a virtual key, a soft key, or a visual key displayed on the touch screen through software processing, or a touch key disposed in the other portion than the touch screen.

The sensing unit 140 may be referred to as a sensor unit.

The sensing unit 140 may include one or more of a depth sensor (not shown), an RGB sensor (not shown), a collision detection sensor (not shown), and a cliff sensor (not shown), and may obtain image data for surroundings of the robot cleaner 500.

The depth sensor may detect that light emitted from a light emitting unit (not shown) is reflected by the object and returned. The depth sensor may measure a distance to an object based on a time difference obtained by detecting a returned light and the amount of the returned light, or the like.

The depth sensor may obtain 2D image information or 3D image information related to the surroundings of the robot cleaner 500 based on the measured distance to the object.

The RGB sensor may obtain color image information for an object or a user around the robot cleaner 500. The color image information may be a captured image of an object. The RGB sensor may be referred to as an RGB camera.

In this case, the camera 121 may mean an RGB sensor.

The collision detection sensor may be referred to as a bumper sensor and may measure an impact amount.

The cliff sensor may measure a distance to a bottom surface of the artificial intelligence device 100.

In this case, the cliff sensor may be implemented with an optical sensor or a depth sensor.

The sensor information obtained by the sensing unit 140 may be used to detect an object or an obstacle.

The output unit 150 may include at least one of a display unit 151, a sound output unit 152, a haptic module 153, and an optical output unit 154.

The display unit 151 displays (outputs) information processed by the robot cleaner 500. For example, the display unit 151 may display execution screen information of an application program running on the robot cleaner 500, or UI (User Interface) or Graphic User Interface (GUI) information according to the execution screen information.

The display unit 151 may implement a touch screen in such a manner that the display unit 151 forms a layer structure with or is integrally formed with a touch sensor. The touch screen may function as the user input unit 720 that provides an input interface between the robot cleaner 500 and the user and may provide an output interface between the robot cleaner 500 and the user.

The sound output unit 152 may output audio data received from the communication unit 110 or stored in the memory 170 in call signal reception, a call mode or a recording mode, a speech recognition mode, a broadcast reception mode, or the like.

The sound output unit 152 may include at least one of a receiver, a speaker, and a buzzer.

The haptic module 153 generates various tactile effects that a user is able to feel. A representative example of the tactile effect generated by the haptic module 153 may be vibration.

The optical output unit 154 outputs a signal for notifying occurrence of an event by using light of a light source of the robot cleaner 500. Examples of events generated by the robot cleaner 500 may include message reception, call signal reception, a missed call, an alarm, schedule notification, email reception, and information reception through an application, and the like.

The driving unit 170 may move the robot cleaner 500 in a specific direction or by a specific distance.

The driving unit 170 may include a left wheel driving unit 171 for driving the left wheel of the robot cleaner 500 and a right wheel driving unit 173 for driving the right wheel.

The left wheel driver 161 may include a motor for driving the left wheel, and the right wheel driver 162 may include a motor for driving the right wheel.

Although the driving unit 160 is illustrated as including the left wheel driving unit 161 and the right wheel driving unit 162 as an example in FIG. 4 the present invention is not limited thereto. That is, in one embodiment, the driving unit 160 may be composed of only one wheel.

The cleaning unit 190 may include at least one of a suction unit 191 or a mopping unit 192 to clean the floor near the robot cleaner 500.

The suction unit 191 may be referred to as a vacuum cleaning unit.

The suction unit 191 may suck foreign substances such as dust or garbage around the robot cleaner 500 by sucking air.

In this case, the suction unit 191 may include a brush or the like as means for collecting the foreign substances.

The mopping unit 192 may wipe the floor in a state in which a mop is in contact with at least a part of the bottom surface of the robot cleaner 500.

In this case, the mopping unit 192 may include a mop, a mop driving unit for moving the mop, and the like.

In this case, the mop of the mopping unit 192 may be adjusted to the distance from the ground through the mop driving unit. That is, the mop driving unit may operate such that the mop is in contact with the floor when mopping is necessary.

The map generating unit 193 generates a map of a cleaning area based on information on the obstacle.

The map generating unit 193 generates the map of the cleaning area based on obstacle information acquired by the artificial intelligence robot while driving the cleaning area during initial operation or when the map for the cleaning area is not stored. In addition, the map generating unit 220 updates a previously-generated map based on the obstacle information acquired while driving.

The map generating unit 193 generates a base map based on obstacle information acquired while driving, and generates an indoor area map by distinguishing areas from each other on the base map.

The base map is a map in which a shape of the cleaning area obtained through driving is displayed with an outline, and the indoor area map is a map in which areas are distinguished on the base map. The base map and the indoor area map include a drivable area of the robot cleaner and obstacle information.

After generating the base map, the map generating unit 193 may divide the cleaning area into a plurality of areas, and generate a map including connection paths connecting the plurality of areas, and information on obstacles in each area.

The map generating unit 193 may process the shape of an area based on the shape of a room in a general home, for example, a square. In addition, the map generating unit 193 expands the shape of the area based on the outermost cell of the base map, and processes the shape of the area by deleting or reducing the area for the inaccessible area due to the obstacle.

In addition, the map generating unit 193 may display obstacles over a certain size on the map according to the size of the obstacle, and delete obstacles below the predetermined cell so that the obstacle is not displayed on the base map. For example, the map generating unit 193 displays furniture such as a chair or a sofa having a certain size on the map, and temporarily removes obstacles, small toys, for example, small toys, etc., from the map. The map generating unit 193 stores the location of the charging station together on the map when the map is generated.

The map generating unit 193 may add an obstacle on the map with respect to the obstacle detected after the map is generated. The map generating unit 193 may add an obstacle to the map when a specific obstacle is repeatedly detected at a fixed position, and ignores the obstacle when the obstacle is temporarily detected.

Figure 5:
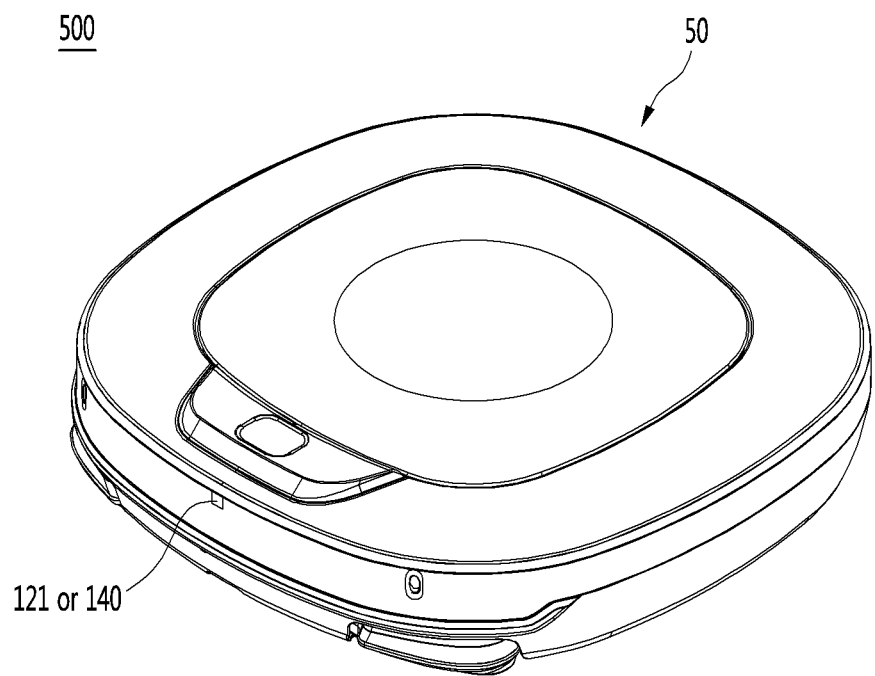
FIG. 5 is a perspective view of a robot cleaner 500 according to an embodiment of the present invention.

FIG. 5 is a perspective view of a robot cleaner 500 according to an embodiment of the present invention.

Referring to FIG. 5, the robot cleaner 500 may include a cleaner body 50, a camera 121, or a sensing unit 140.

The camera 121 or the sensing unit 140 may project light toward the front and receive a reflected light.

The camera 121 or the sensing unit 140 may obtain depth information by using a time difference between projected light and returned light.

The cleaner body 50 may include other components except for the camera 121 and the sensing unit 140 among the components described with reference to FIG. 4.

Figure 6:
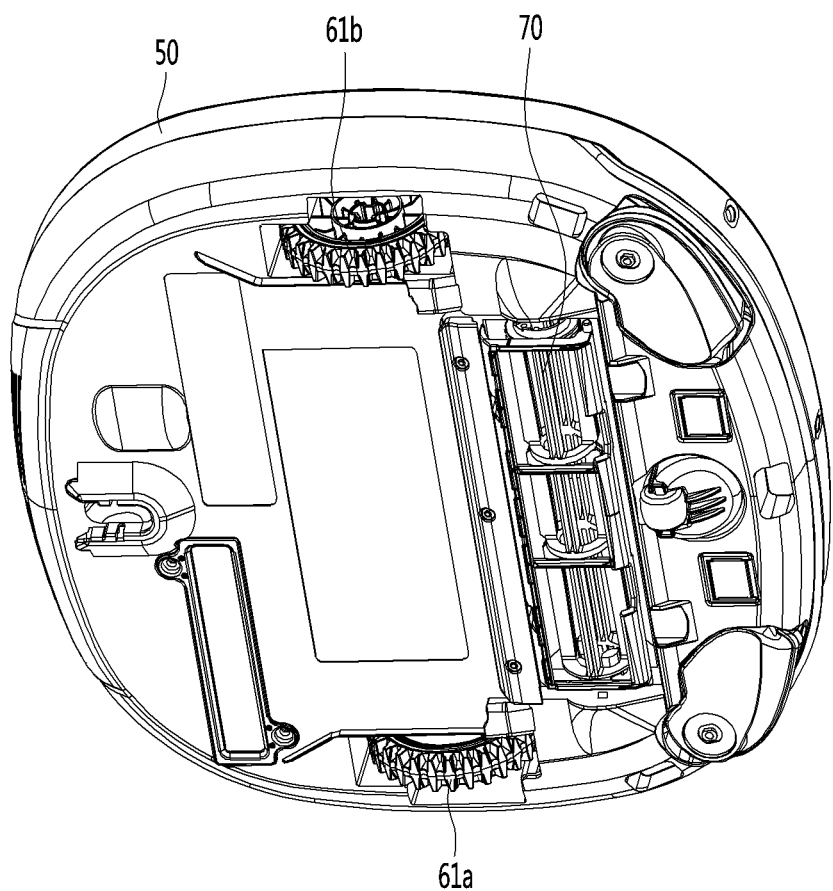
FIG. 6 is a bottom view of the robot cleaner 500 according to an embodiment of the present invention.

FIG. 6 is a bottom view of the robot cleaner 500 according to an embodiment of the present invention.

Referring to FIG. 6, in addition to the configuration of FIG. 4, the robot cleaner 500 may further include a cleaner body 50, a left wheel 61a, a right wheel 61b, and a suction unit 70.

The left wheel 61a and the right wheel 61b may drive the cleaner body 50.

A left wheel driving unit 161 may drive the left wheel 61a, and a right wheel driving unit 162 may drive the right wheel 61b.

As the left wheel 61a and the right wheel 61b are rotated by the driving unit 160, the robot cleaner 500 may suck foreign substances such as dust or garbage through the suction unit 70.

The suction unit 70 may be provided in the cleaner body 50 to suck dust from a floor.

The suction unit 70 may further include a filter (not shown) that collects foreign substances from sucked airflow, and a foreign substance receiver (not shown) in which foreign substances collected by the filter are accumulated.

In addition, the robot cleaner 500 may further include a mopping unit (not shown) in addition to the configuration of FIG. 4.

The mopping unit (not shown) may include a mop (not shown) and a motor (not shown) that rotates the mop in a state in which the mop is in contact with the floor or moves according to a set pattern. The robot cleaner 500 may wipe the floor through the mopping unit (not shown).

Figure 7:
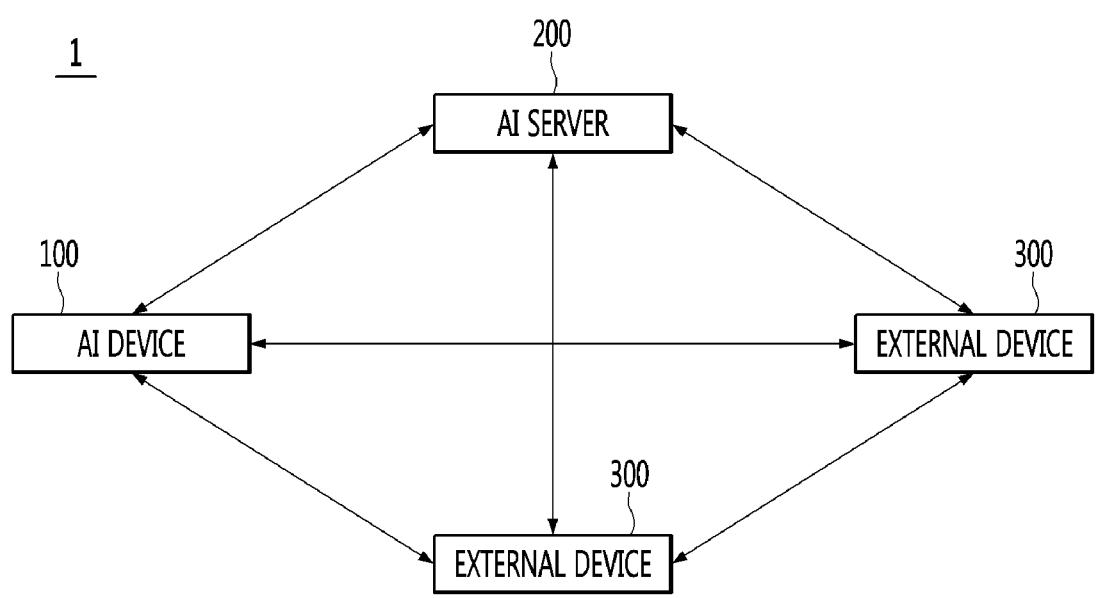
FIG. 7 is a diagram illustrating an example of an artificial intelligence system 1 according to an embodiment of the present invention.

FIG. 7 is a diagram illustrating an example of an artificial intelligence system 1 according to an embodiment of the present invention.

Referring to FIG. 7, the artificial intelligence system 1 may include an artificial intelligence device 100, an artificial intelligence server 200, and one or more external devices 300.

The artificial intelligence device 100, the artificial intelligence server 200, and the external devices 300 may communicate with one another using wired or wireless communication technology.

In particular, some of the artificial intelligence device 100, the artificial intelligence server 200, or the external devices 300 may communicate with each other using 5G network technology.

In addition, the artificial intelligence device 100 may obtain identification information and location information of at least one external device 300. The artificial intelligence device 100 may identify each of the one or more external devices 300. When the artificial intelligence device 100 receives data from the external device 300, the artificial intelligence device 100 may identify the external device 300 that transmits the data and determine a location of the external device 300.

The external device 300 may include the robot cleaner 500, an artificial intelligence robot, an IoT apparatus, a television, an air conditioner, a refrigerator, a washing machine, a home security camera, an air purifier, an IoT device, or a home appliance, and the like.

For example, the external device 300 may include at least one of a microphone capable of collecting speech data, a camera or image sensor capable of collecting image data, and a depth sensor capable of collecting object distance data.

In addition, when the external device 300 is a movable device, moving route data may be collected while driving. For example, when the external device 300 is the robot cleaner 500, the robot cleaner 500 may collect moving route data, which is data about a route that has traveled for cleaning. In addition, the robot cleaner 500 may generate indoor area map data through the map generating unit 193.

In addition, when the external device 300 is a device provided with a camera capable of collecting image data, the external device 300 may obtain indoor area image data. For example, when the external device 300 is a home security camera, the external device 300 may photograph images for each area, and obtain indoor area image data.

The external device 300 may obtain data including at least one of speech data, image data, object distance data, indoor area map data, and indoor area image data, and transmit the obtained data to the artificial intelligence device 100.

Figure 8:
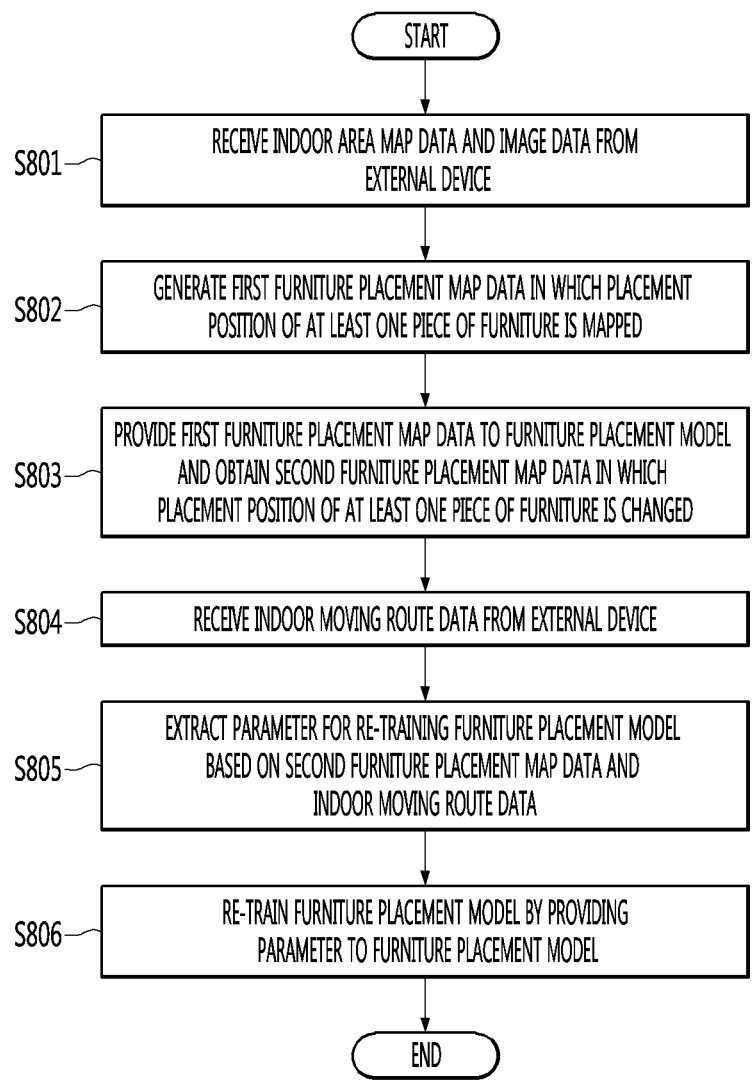
FIG. 8 is a flowchart for describing a method of operating an artificial intelligence device for guiding furniture displacement according to an embodiment of the present invention.

FIG. 8 is a flowchart for describing a method of operating an artificial intelligence device for guiding furniture displacement according to an embodiment of the present invention.

The communicating unit may receive indoor area map data and indoor area image data from at least one external device 300 (S801).

When the external device 300 is the robot cleaner 500, the indoor area map data may be data about an indoor area map generated by the robot cleaner 500.

The indoor area map data may include data regarding a map in which the shape of a cleaning area obtained through the driving by the external device 300 capable of driving is displayed with an outline. Therefore, the indoor area map data may include data regarding the structure of a room. In addition, the indoor area map data may include data regarding locations of obstacles detected during driving by the external device 300 that is capable of driving. Therefore, the indoor area map data may include data regarding the shape, size, and location of at least one obstacle.

In addition, the indoor area image data may be image data for each indoor area obtained by the external device 300 through a camera. For example, when the external device 300 is a home security camera, the indoor area image data may be image data of an indoor area acquired by the home security camera. For example, when the external device 300 is a home security camera installed in a living room, the indoor area image data may be living room image data obtained by the home security camera installed in the living room.

The processor 180 may generate first furniture placement map data in which a placement location of at least one piece of furniture is mapped based on the received indoor area map data and the indoor area image data (S802).

For example, the processor 180 may extract data about an indoor floor plan that allows a user to figure out the structure of a room based on the indoor area map data. In addition, the indoor floor plan data may include data on the shape, size, and location of at least one obstacle.

In addition, the processor 180 may extract the type, shape, size, and/or placement location of at least one piece of furniture for each area based on the indoor area image data. For example, the processor 180 may extract the shape, size, and/or location of a sofa disposed in the living room based on living room image data received from the home security camera installed in the living room.

Therefore, the processor 180 may generate first furniture placement map data in which a placement location of at least one piece of furniture is mapped based on the indoor area map data and the indoor area image data received from at least one external device.

The processor 180 may output first furniture placement map data through the output unit 150. Therefore, the user may figure out the structure and furniture placement of a room using the artificial intelligence device 100.

The processor 180 may provide the first furniture placement map data to a furniture placement model to obtain second furniture placement map data in which the placement location of at least one piece of furniture is changed (S803).

Figure 9:
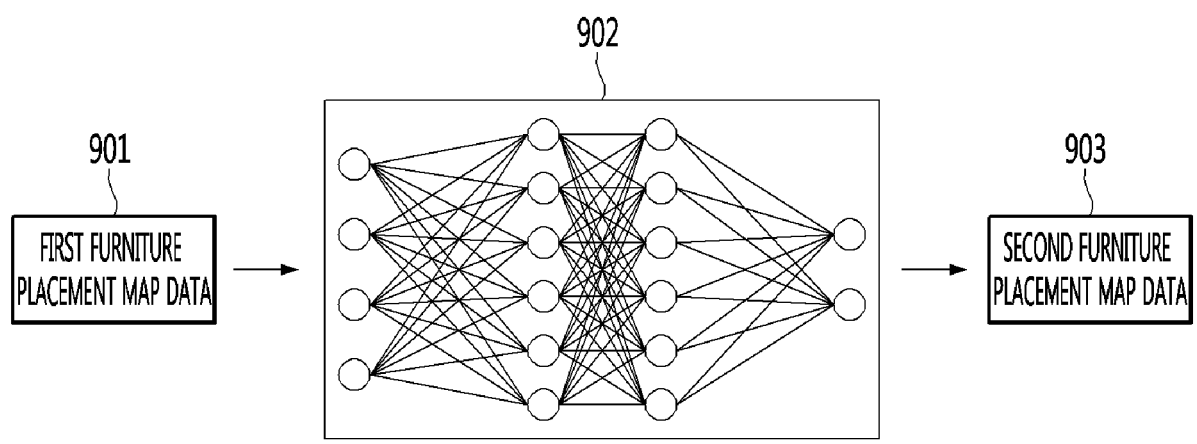
FIGS. 9 to 11 are diagrams for describing a furniture displacement model according to an embodiment of the present invention.

Referring to FIG. 9, the processor 180 provides the first furniture placement map data 901 to the furniture placement model 902 to obtain the second furniture placement map data 903 in which the arrangement position of at least one piece of furniture is changed.

The furniture placement model may be an artificial intelligence model trained based on indoor area map data and furniture placement location information for training.

For example, the furniture placement model may be a neural network learned by labeling each of at least one training indoor area map data with information on at least one training furniture placement location.

Federated learning may be applied to the furniture placement model. The artificial intelligence device 100 may download a common furniture placement model and train the furniture placement model within the artificial intelligence device 100 without transmitting data from the external device 300 or the artificial intelligence device 100 to a separate cloud server. The artificial intelligence device 100 may improve the common furniture placement model by transmitting the improved furniture placement model to a separate cloud server.

In addition, the furniture placement model may be an artificial neural network-based model learned by a deep learning algorithm or a machine learning algorithm. The furniture placement model may be a model learned through reinforcement learning.

Herein, an artificial neural network whose parameters are to be determined or to be continuously updated by performing learning through reinforcement learning may be referred to as a reinforcement learning model.

The reinforcement learning may be performed primarily by the Markov Decision Process (MDP).

In the Markov Decision Process (MDP), first, an environment in which information necessary for an agent to perform a next action is composed.

Second, how the agent acts based on environment in the environment is defined.

Third, what the agent does well to reward and if not, penalty.

Fourth, it will be repeated until the reward of the future reaches its peak, leading to optimal policy.

Applying the Markov decision process to the present invention, the agent may be an artificial intelligence device 100 or a furniture placement model. Here, the training indoor area map data may be data extracted based on a floor plan of an indoor space structure. In addition, the processor 180 may label training indoor area map data with information on at least one training furniture placement location, based on the data on a floor plan in which at least one furniture placement is illustrated. The floor plan in which at least one furniture placement is mapped may be collected from data on a model house floor plan.

In addition, the processor 180 may extract data on the floor plan structure and data on the current placement position of at least one piece of furniture from first furniture placement map data and provide the same to the furniture placement model.

The furniture placement model may determine and output the placement position of the at least one piece of furniture by using the data on the floor plan structure and the data on the current placement position of at least one piece of furniture as input values. The placement position of the at least one piece of furniture output may be a position changed from a previous placement position. Thus, the furniture placement model may suggest changing of the furniture placement by outputting the changed placement position.

The processor 180 may obtain second furniture placement map data in which a placement position of at least one piece of furniture is changed.

In addition, the processor 180 may obtain second furniture placement map data in which the placement position of the at least one piece of furniture is changed, based on the placement position of the at least one piece of furniture output from the furniture placement model. In this case, the second furniture placement map data may include information about the placement position of at least one piece of furniture output from the furniture placement model.

The processor 180 may output the second furniture placement map data through the output unit 150. In addition, the processor 180 may display a placement guide screen displaying the second furniture placement map data through a display unit. Therefore, the artificial intelligence device 100 may guide the user to the optimal furniture placement position.

The communication unit 110 may receive indoor moving route data from at least one external device (S804).

When the external device 300 is a device capable of traveling, the external device 300 may collect moving route data on a driving route while traveling indoors. For example, when the external device 300 is the robot cleaner 500, the robot cleaner 500 may collect moving route data, which is data about a route that has traveled for cleaning. In addition, the robot cleaner 500 may collect moving route data, which is data about a driving route, based on the position information of the robot cleaner 500. The external device 300 may transmit the indoor moving route data to the artificial intelligence device 100.

The processor 180 may extract a parameter for training the furniture placement model based on the second furniture placement map data and the indoor moving route data (S805). In addition, the processor 180 may provide the extracted parameter to the furniture placement model to train the furniture placement model (S806).

The processor 180 may extract a parameter for training the furniture placement model based on the second furniture placement map data and the indoor moving route data, and provide the parameter to the furniture placement model to train the furniture placement model.

Figure 10:
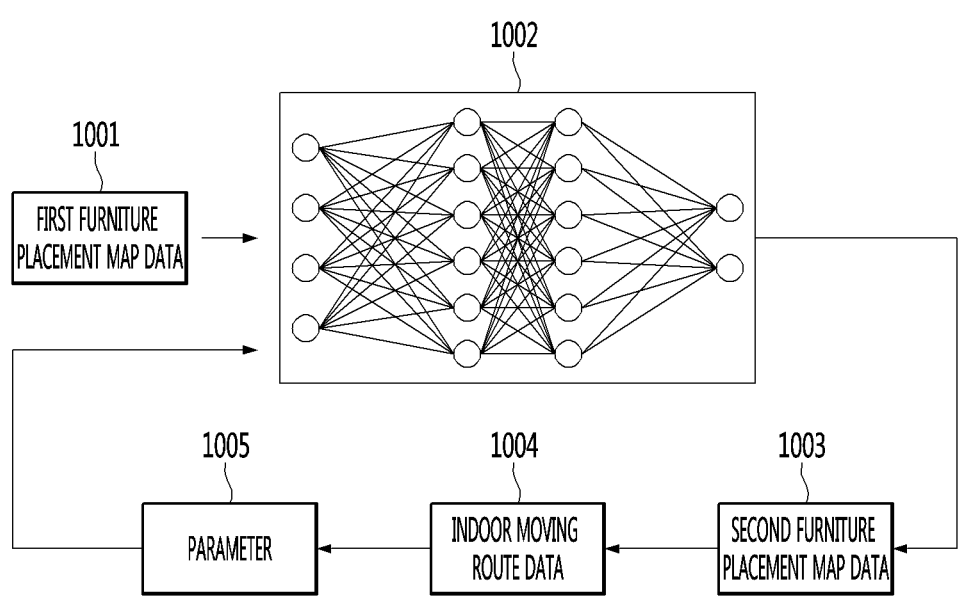

Referring to FIG. 10, the processor 180 may provide the first furniture placement map data 1001 as an input value of the furniture placement model 1002, and obtain second furniture placement map data 1003 in which furniture placement location output by the furniture placement model is mapped. In addition, the processor 180 may extract a parameter 1005 for training the furniture placement model based on the indoor moving route data 1004 and provide the parameter 1005 to the furniture placement model 1002.

The processor 180 may extract a moving distance between indoor areas based on the second furniture placement map data and the indoor moving route data, extract a reward parameter or a penalty parameter based on the extracted inter-area moving distance, and provide the reward parameter or the penalty parameter to the furniture placement model to train the furniture placement model. In this case, the processor 180 may store the extracted inter-area moving distance in the memory 170.

For example, the processor 180 may extract a moving distance from an area 'A' to an area 'B' based on the second furniture placement map data and the indoor moving route data. The moving distance from the area 'A' to the area 'B' may vary according to the placement of furniture in a room, and the processor 180 may extract the moving distance from the area 'A' to the area 'B' based on the moving route data collected while driving by the external device 300.

In addition, the processor 180 may store, in the memory 170, the extracted moving distance from the area 'A' and the area 'B'.

In addition, the processor 180 may extract a reward parameter or a penalty parameter based on the extracted inter-area moving distance.

For example, the processor 180 may compare the extracted moving distance from the area 'A' to the area 'B' with a previously-measured moving distance from the area 'A' to the area 'B', thereby extracting the reward or penalty parameter.

The processor 180 may extract the reward parameter when the moving distance from the area 'A' to the area 'B' is shorter than the previously-measured moving distance from the area 'A' to the area 'B' due to the change of the furniture placement.

Alternatively, the processor 180 may extract the penalty parameter when the moving distance from the area 'A' to the area 'B' is longer than the previously-measured moving distance from the area 'A' to the area 'B' due to the change of the furniture placement.

In addition, the processor 180 may train the furniture placement model by providing the extracted reward parameter or penalty parameter to the furniture placement model.

The processor 180 may extract a moving distance between a plurality pieces of furniture based on the second furniture placement map data and the indoor moving route data, extract a reward parameter or a penalty parameter based on the extracted moving distance between the pieces of furniture, and provide the reward parameter or the penalty parameter to the furniture placement model to train the furniture placement model.

For example, the processor 180 may extract a moving distance between a 'sofa' and a 'desk' and perform comparison with a moving distance between the 'sofa' and the 'desk' before the change of furniture placement based on the extracted moving distance to extract the reward or penalty parameter.

In addition, the processor 180 may extract a moving distance between at least one piece of furniture and at least one area based on the second furniture placement map data and the indoor moving route data, extract a reward parameter or a penalty parameter based on the extracted moving distance, and provide the reward parameter or the penalty parameter to the furniture placement model to train the furniture placement model.

As the reward or penalty parameter is provided to the furniture placement model, the furniture placement model is repeatedly trained until a future reward reaches a peak, thus obtaining the optimal policy, that is, the optimal placement location of the furniture to minimize the moving distance.

The processor 180 may extract a plurality of gaze measurement points based on the second furniture placement map data, extract a parameter for training the furniture placement model based on whether at least one piece of furniture is located between the plurality of gaze measurement points, and provide the parameter to the furniture placement model, thus training the furniture placement model.

Figure 11:
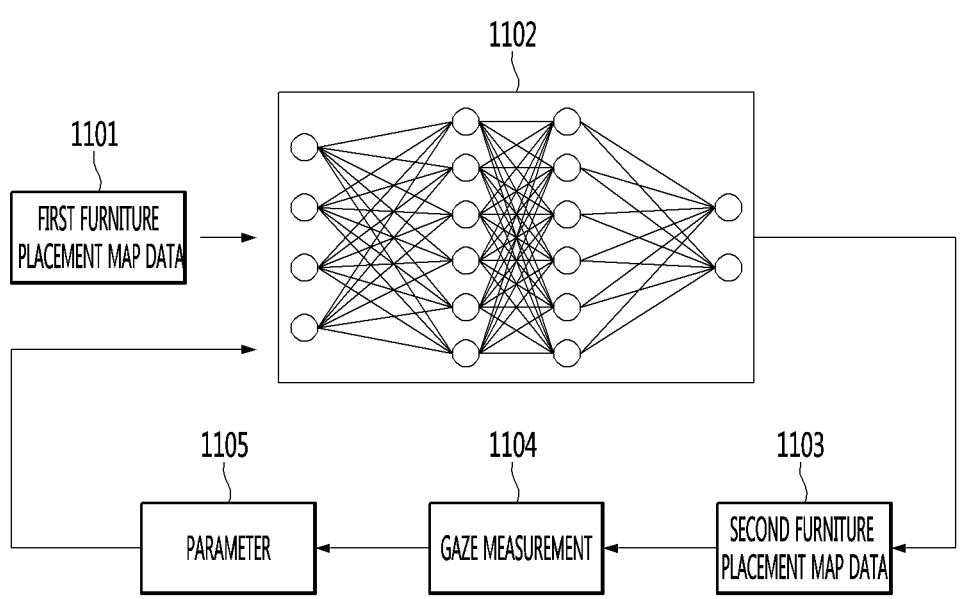

Referring to FIG. 11, the processor 180 may provide the first furniture placement map data 1001 as an input value of the furniture placement model 1002, and obtain second furniture placement map data 1103 in which furniture placement location output by the furniture placement model is mapped. In addition, the processor 180 may extract a parameter 1105 for training the furniture placement model based on the gaze measurement result 1104 for the plurality of gaze measurement points and provide the parameter 1005 to the furniture placement model 1002 to train the furniture placement model.

The processor 180 may extract any two points as gaze measurement points based on the second furniture placement map data.

In addition, the processor 180 may extract a representative point of at least one user activity area based on the second furniture placement map data. For example, the processor 180 may extract the representative point of a kitchen area based on the second furniture placement map data. In addition, the processor 180 may extract the representative point of at least one indoor/outdoor passage area based on the second furniture placement map data. For example, the processor 180 may extract the representative point of a window area based on the second furniture placement map data. In this case, the processor 180 may extract the representative point of the at least one user activity area and the representative point of the at least one indoor/outdoor passage area as the plurality of gaze measurement points.

In addition, the processor 180 may extract a parameter for training the furniture placement model based on whether at least one piece of furniture is located between the plurality of gaze measurement points, and provide the parameter to the furniture placement model, thus training the furniture placement model.

For example, the processor 180 may extract the representative point of the kitchen area and the representative point of the window area as the gaze measurement points. The processor 180 may extract a reward parameter when the furniture is not located between the two points to secure the gaze of the user. Alternatively, the processor 180 may extract a penalty parameter when the furniture is located between the two points and interferes with the gaze of the user.

Figure 12:
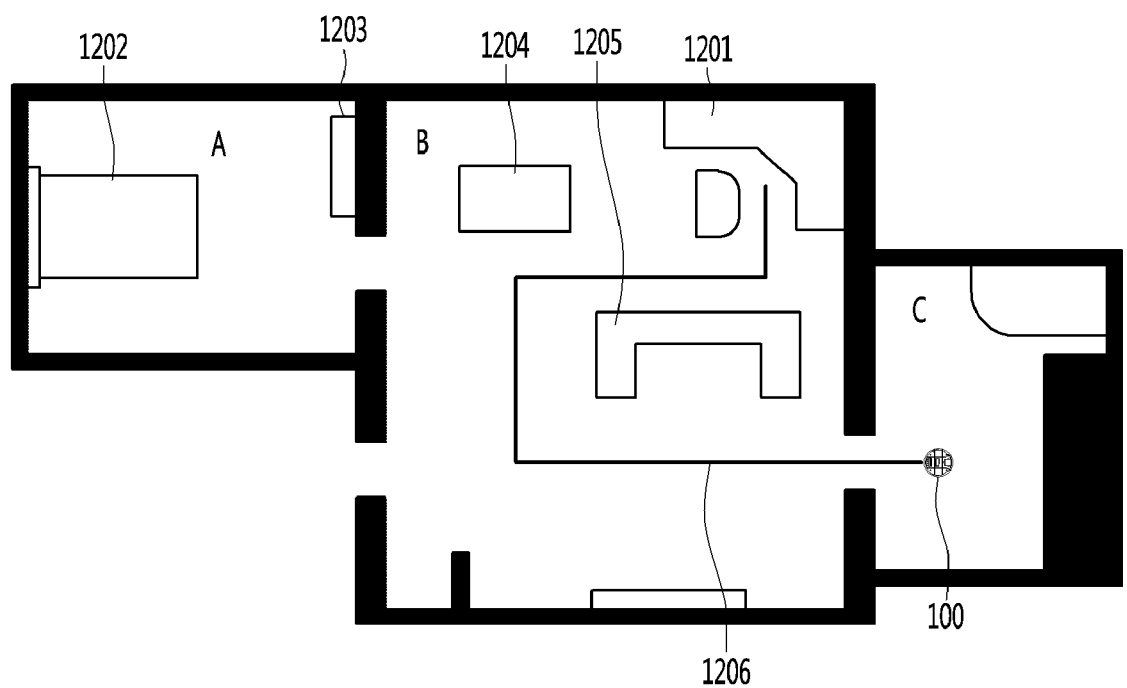
FIGS. 12 and 13 are diagrams for describing an artificial intelligence device for guiding an optimal placement position of furniture using a moving route data of a robot cleaner, according to an embodiment of the present invention.
Figure 13:
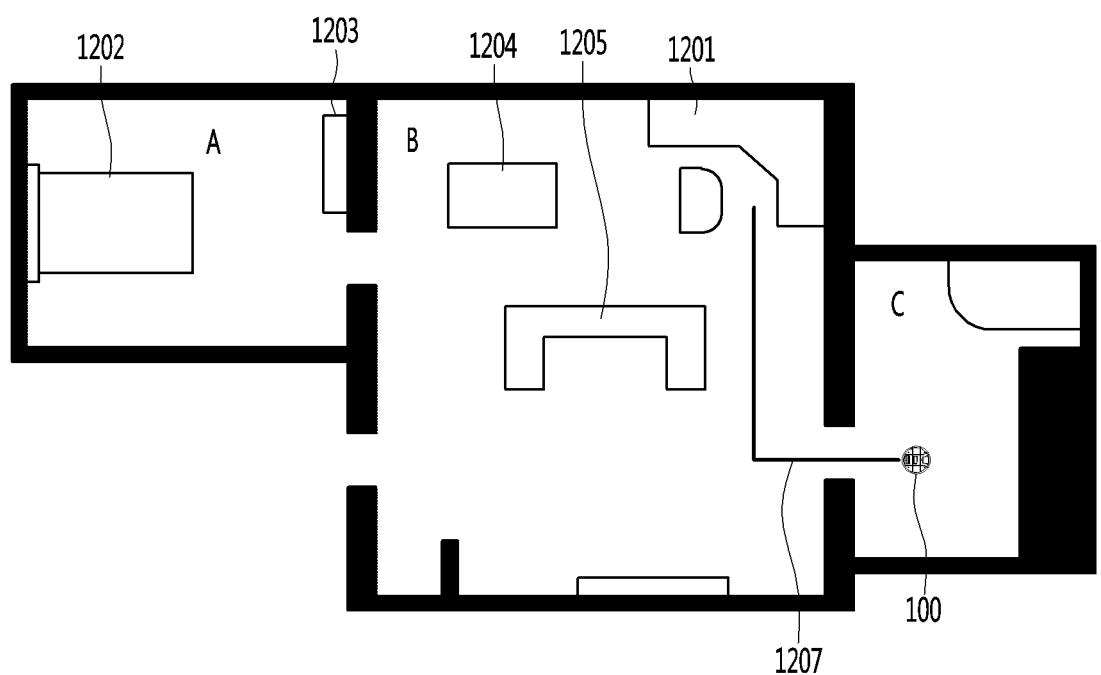

As the reward or penalty parameter is provided to the furniture placement model, the furniture placement model is repeatedly trained until a future reward reaches a peak, thus obtaining the optimal policy, that is, the optimal placement position of the furniture to maximally secure the gaze of the user. FIGS. 12 and 13 are diagrams for describing an artificial intelligence device for guiding an optimal placement position of furniture by using moving route data of a robot cleaner according to an embodiment of the present invention.

The processor 180 may obtain a furniture placement map in which an indoor area is divided into an area 'A', an area 'B', and an area 'C', and a desk 1201, a bed 1202, a bookcase 1203, a dining table 1204 and a sofa 1205 are mapped into placement locations. In addition, it is possible to obtain a moving distance 1206 for a driving path from the area 'C' to the desk 1201 based on moving route data received from the robot cleaner 500.

The processor 180 may train the furniture placement model by extracting a parameter based on the moving distance 1206.

The processor 180 may obtain furniture placement map data in which the sofa 1205 output by the furniture placement model is mapped into a changed placement position.

The processor 180 may obtain a moving distance 1207 for the driving path from the area 'C' to the desk 1201 based on the moving data received from the robot cleaner 500. The processor 180 may extract the reward parameter, extract the reward parameter, and provide it to the furniture placement model because the current moving distance 1207 is shorter than a previously-measured moving distance 1206.

Figure 14:
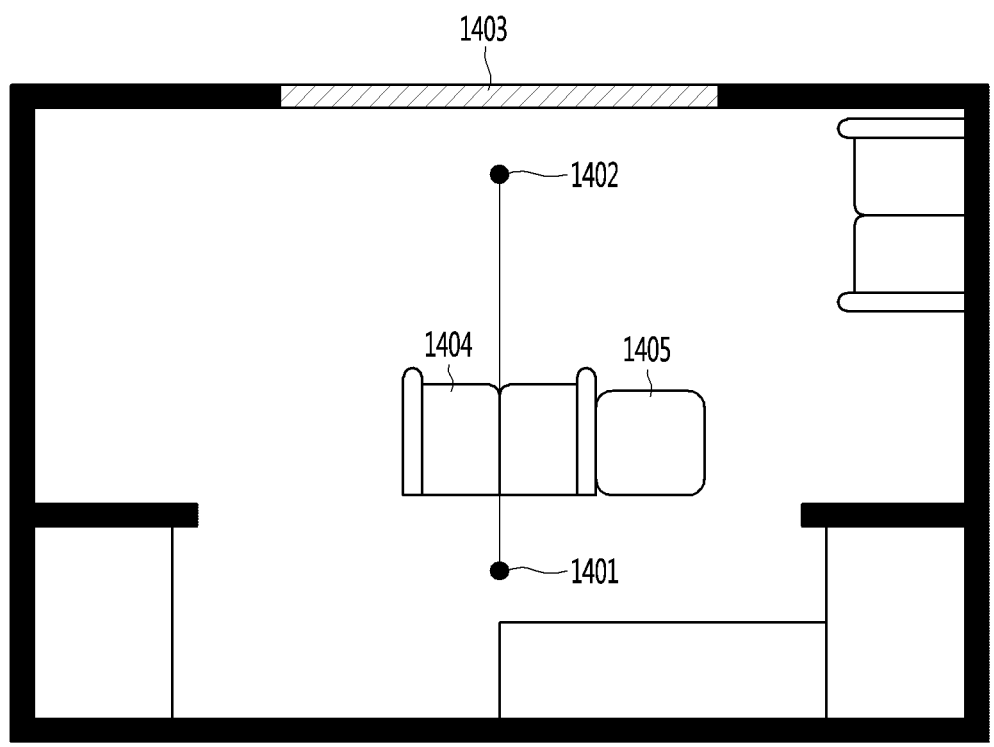
FIGS. 14 and 15 are diagrams for describing an artificial intelligence device for guiding an optimal placement position of furniture for securing a user's gaze, according to an embodiment of the present invention.
Figure 15:
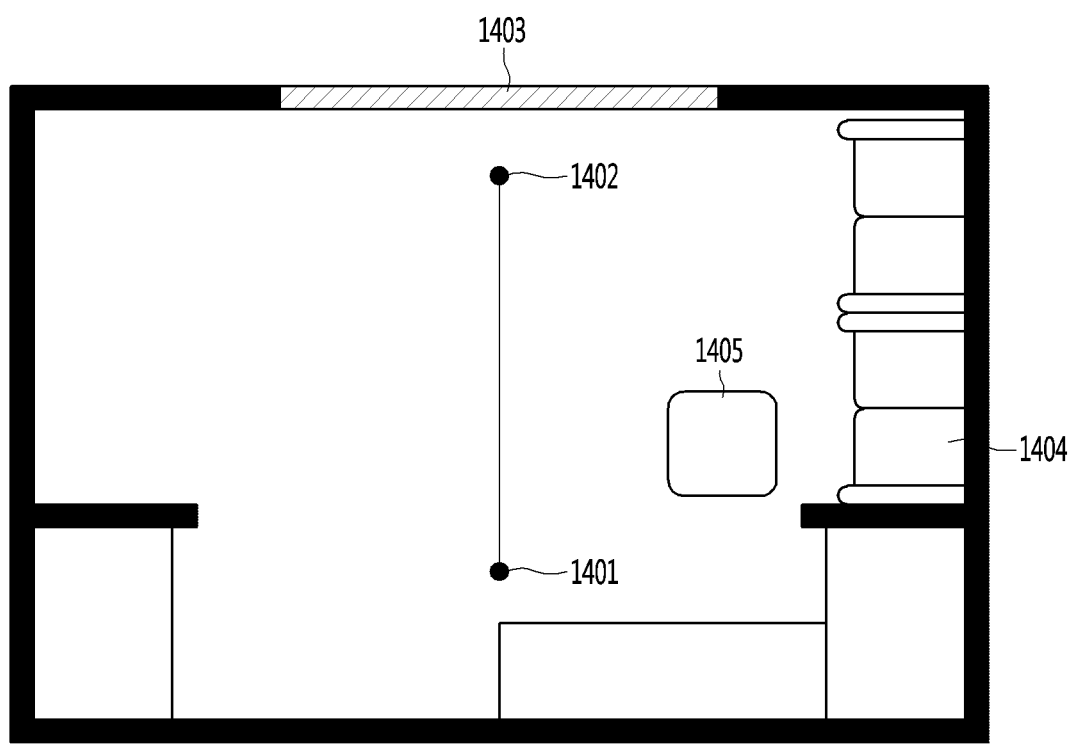

FIGS. 14 and 15 are diagrams for describing an artificial intelligence device for guiding an optimal placement position of furniture for securing a user's gaze, according to an embodiment of the present invention.

The processor 180 may extract a representative point 1401 of a kitchen area and a representative point 1402 of a window 1403 area as the gaze measurement point.

When the sofa 1404 is located between two points and interferes with the user's gaze, the processor 180 may extract a penalty parameter to train the furniture placement model.

The processor 180 may obtain furniture placement map data in which the sofa 1404 is mapped into a changed placement position using the trained furniture placement model.

The present invention described above may be embodied as computer readable codes on a medium in which a program is recorded. The computer-readable medium includes all kinds of recording devices in which data readable by a computer system is stored. Examples of the computer readable medium may include a hard disk drive (HDD), a solid state disk (SSD), a silicon disk drive (SDD), a ROM, a RAM, a CD-ROM, a magnetic tape, a floppy disk, an optical data storage device, and the like. In addition, the computer may include the processor 180 of the terminal.

What is claimed is:

1. An artificial intelligence device for guiding furniture placement, the artificial intelligence device comprising:
   a transceiver configured to receive indoor area map data and indoor area image data from at least one external device; and
   a processor configured to generate first furniture placement map data in which a placement position of at least one piece of furniture is mapped, provide the first furniture placement map data to a furniture placement model, and obtain second furniture placement map data in which the placement position of the at least one piece of furniture is changed, based on the indoor area map data and the indoor area image data,
   wherein the processor is further configured to:
   extract two points as gaze measurement points based on the second furniture placement map data;
   extract a reward parameter based on the at least one piece of furniture not being located between the two points to secure a gaze of a user;
   extract a penalty parameter based on the at least one piece of furniture being located between the two points and interfering with the gaze of the user; and
   provide the reward parameter or the penalty parameter to the furniture placement model to train the furniture placement model,
   wherein the two points are selected as the gaze measurement points from a plurality of representative points of at least one user activity area and a plurality of representative points of at least one indoor/outdoor passage area.

2. The artificial intelligence device of claim 1, wherein the furniture placement model is a neural network trained by labeling at least one training indoor area map data with at least one training furniture placement location.

3. The artificial intelligence device of claim 1, wherein the transceiver is further configured to receive indoor moving route data from the at least external device, and
   wherein the processor is further configured to extract a parameter for training the furniture placement model based on the second furniture placement map data and the indoor moving route data, and provide the parameter to the furniture placement model to train the furniture placement model.

4. The artificial intelligence device of claim 3, wherein the processor is configured to extract a moving distance between indoor areas based on the second furniture placement map data and the indoor moving route data, extract a second reward parameter or a second penalty parameter based on the extracted inter-area moving distance, and provide the second reward parameter or the second penalty parameter to the furniture placement model to train the furniture placement model.

5. The artificial intelligence device of claim 3, wherein the processor is configured to extract a moving distance between a plurality of pieces of furniture based on the second furniture placement map data and the indoor moving route data, extract a second reward parameter or a second penalty parameter based on the extracted moving distance between the pieces of furniture, and provide the second reward parameter or the second penalty parameter to the furniture placement model to train the furniture placement model.

6. The artificial intelligence device of claim 1, further comprising:
a display configured to display a placement guide screen that displays the second furniture placement map data.

7. The artificial intelligence device of claim 1, wherein the transceiver is further configured to receive indoor area map data and indoor area image data which are obtained during driving by a robot cleaner.

8. A method of operating an artificial intelligence device for guiding furniture placement, the method comprising:
receiving indoor area map data and indoor area image data from at least one external device;
generating first furniture placement map data in which a placement location of at least one piece of furniture is mapped based on the received indoor area map data and the received indoor area image data;
providing the first furniture placement map data to a furniture placement model to obtain second furniture placement map data in which the placement location of at the least one piece of furniture is changed;
extracting two points as gaze measurement points based on the second furniture placement map data;
extracting a reward parameter based on the at least one piece of furniture not being located between the two points to secure a gaze of a user;
extracting a penalty parameter based on the at least one piece of furniture being located between the two points and interfering with the gaze of the user; and
providing the reward parameter or the penalty parameter to the furniture placement model to train the furniture placement model,
wherein the two points are selected as the gaze measurement points from a plurality of representative points of at least one user activity area and a plurality of representative points of at least one indoor/outdoor passage area.

9. The method of claim 8, wherein the furniture placement model is a neural network trained by labeling at least one training indoor area map data with at least one training furniture placement location.

10. The method of claim 8, further comprising:
receiving indoor moving route data from the at least one external device;
extracting a parameter for training the furniture placement model based on the second furniture placement map data and the indoor moving route data; and
training the furniture placement model by providing the parameter to the furniture placement model.

11. The method of claim 10, wherein the extracting of the parameter includes:
extracting a moving distance between indoor areas based on the second furniture placement map data and the indoor moving route data; and
extracting a second reward parameter or a second penalty parameter based on the extracted inter-area moving distance, and
wherein the training of the furniture placement model includes training the furniture placement model by providing the second reward parameter or the second penalty parameter to the furniture placement model.

12. The method of claim 10, wherein the extracting of the parameter includes:
extracting moving distances between a plurality of pieces of furniture based on the second furniture placement map data and the indoor moving route data; and
extracting a second reward parameter or a second penalty parameter based on the extracted inter-furniture moving distance, and
wherein the training of the furniture placement model includes training the furniture placement model by providing the second reward parameter or the second penalty parameter to the furniture placement model.

13. The method of claim 8, further comprising:
displaying a placement guide screen that displays the second furniture placement map data.

14. The method of claim 8, wherein receiving indoor area map data and indoor area image data includes receiving indoor area map data and indoor area image data obtained during driving by a robot cleaner.

* * * * *